ent Number: 4,922,130
Date of Patent: May 1, 1990

[54] HIGH PERFORMANCE TRACK/HOLD FOR A DIGITAL MULTIMETER

[75] Inventor: Ronald L. Swerlein, Longmont, Colo.

[73] Assignee: Hewlett-Packard Company, Palo Alto, Calif.

[21] Appl. No.: 198,941

[22] Filed: May 26, 1988

[51] Int. Cl.$^5$ .................. H03K 5/159; H03L 5/00
[52] U.S. Cl. .................. 307/353; 307/264; 307/296.5; 341/122; 328/127; 328/151
[58] Field of Search .......... 307/352, 264, 353, 296 R; 330/9; 341/122–125; 328/127

[56] References Cited

U.S. PATENT DOCUMENTS

| | | | |
|---|---|---|---|
| 3,581,305 | 5/1971 | Howlett | 341/122 |
| 4,065,766 | 12/1977 | Butler et al. | 341/17 Q |
| 4,070,666 | 1/1978 | Butler et al. | 341/172 |
| 4,070,667 | 1/1978 | Eichelberger | 341/122 |
| 4,074,260 | 2/1978 | Butler et al. | 341/118 |
| 4,093,874 | 6/1978 | Pollitt | 307/352 |
| 4,138,666 | 2/1979 | Eichelberger et al. | 341/118 |
| 4,145,689 | 3/1979 | Butler et al. | 341/136 |
| 4,180,807 | 12/1979 | Eichelberger et al. | 341/136 |
| 4,250,494 | 2/1981 | Butler et al. | 341/136 |
| 4,651,034 | 3/1987 | Sato | 307/352 |
| 4,687,998 | 8/1989 | Takatori et al. | 307/352 |

FOREIGN PATENT DOCUMENTS

| | | | |
|---|---|---|---|
| 2441192 | 3/1976 | Fed. Rep. of Germany | 307/352 |
| 2843217 | 4/1979 | Fed. Rep. of Germany | 341/122 |

Primary Examiner—Stanley D. Miller
Assistant Examiner—Richard Roseen
Attorney, Agent, or Firm—Edward L. Miller

[57] ABSTRACT

A track/hold circuit having a holding capacitor whose voltage is replicated by a non-inverting unity gain output amplifier combines both high-speed operation and compensation for errors affecting linearity. The holding capacitor is coupled to the input voltage through two junction field effect transistors (JFET's) that are in series. Both JFET's are on when the circuit is in TRACK. To switch from TRACK to HOLD the JFET nearest the holding capacitor is switched off before the JFET nearest the input voltage. A first source of pedestal error in the output voltage from the output amplifier is rendered constant and well behaved, so that it may be calibrated out. This rendering is accomplished by limiting the voltage swing on the gate of the JFET nearest the holding capacitor to be between the input voltage itself (when that JFET is on) at one extreme and a fixed voltage offset from the input voltage (when that JFET is off) at the other extreme. The fixed voltage offset from the input voltage is derived from the output voltage, which normally equals the input voltage. Feed-through errors and a second source of pedestal error are eliminated by a third FET coupled between the junction of the first two and the output voltage. The third FET is off during TRACK and on during HOLD. The three FET's are switched in a particular order to transition from TRACK to HOLD.

6 Claims, 6 Drawing Sheets

HIGH PERFORMANCE TRACK/HOLD FOR A DIGITAL MULTIMETER

FIELD OF THE INVENTION

The present invention pertains to the measurement of voltages. In particular, it pertains to ways of quickly and accurately determining the instantaneous value of a voltage, such as for analog to digital conversion within a digital voltmeter. The invention is especially useful in situations where the voltage to be measured varies as a function of time (i.e., the voltage is or has an AC voltage component). Means to do this sort of thing fall into one of two general categories: (a) sample and then hold circuits; and (b), track and then hold circuits.

A sample/hold circuit periodically connects a voltage storage element (e.g., a small-valued capacitor) to the voltage of interest. As soon as the capacitor has had time to charge the capacitor is disconnected from the voltage being sampled and its charge is applied to another circuit, such as a buffer amplifier of suitably high input impedance. The output of the buffer amplifier remains fixed at a voltage corresponding to the charge on the holding capacitor until either another sample is taken or the charge on the capacitor leaks off.

A track/hold circuit includes a voltage storage element (e.g., a small-valued holding capacitor) whose charge is continuously changed to reflect the value of the voltage of interest. For example, an input buffer amplifier may accept as its input the voltage of interest, and have as its output load the holding capacitor. The holding capacitor is connected to the voltage of interest or its buffered counterpart through a switch that is closed while the charge on the holding capacitor is to track the applied input voltage, and that is opened when the instantaneous value is to be held. The voltage across the holding capacitor is applied to an output buffer amplifier, from whence it is available for use. The present invention applies to track/hold circuits, and is especially useful in digital voltmeters of the type employing multi-slope integration. The invention affords an unparallel combination of high-speed sampling with high accuracy.

DESCRIPTION OF SOME PRIOR SOLUTIONS

Figure 1:
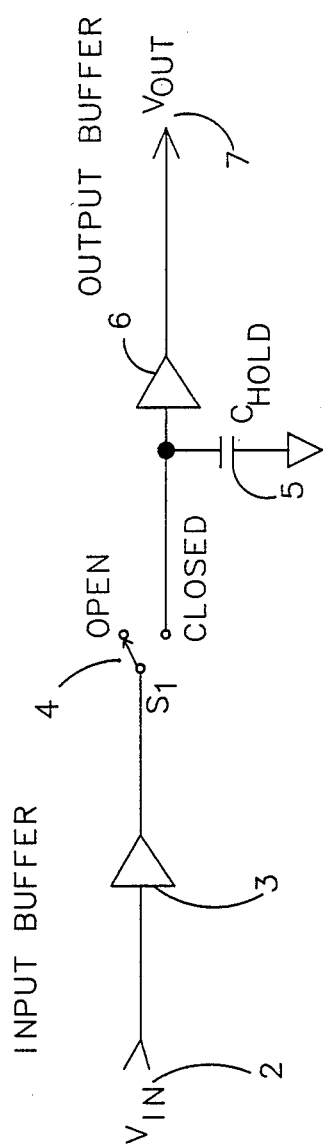
FIG. 1 is a simplified schematic diagram of the basic prior art track/hold circuit.

Refer now to FIG. 1, wherein is depicted a simplified schematic diagram of the basic prior art track/hold circuit 1. An input voltage $V_{in}$ 2 is to be tracked and held. To this end it is applied to an input buffer amplifier 3 whose output is connected through a switch $S_1$ 4 to a holding capacitor $C_{hold}$ 5. The purpose of the input buffer 3 is to continuously keep $C_{hold}$ charged to the instantaneous value of $V_{in}$, without $V_{in}$ being loaded down by $C_{hold}$. To this end the input buffer 3 must have suitably high input impedance (so as not to load $V_{in}$), suitably low output impedance (so as to be able to drive $C_{hold}$), and suitable frequency response and gain accuracy (so that the held voltage is really the same as the instantaneous value of $V_{in}$ that existed when the hold was put into effect). In this way the voltage across $C_{hold}$ 5 is made to track the input value $V_{in}$ 2 while switch $S_1$ 4 is closed.

When the instantaneous value of the input voltage $V_{in}$ 2 is to be held $S_1$ 4 is opened (and presumably very abruptly, too). Since $C_{hold}$ 5 has been tracking $V_{in}$ it continues to exhibit the last value $V_{in}$ possessed as the switch $S_1$ 4 opened. That last value is applied to an output buffer 6, from whose output is obtained an output voltage $V_{out}$ 7. The frequency response required of the output buffer 6 is not related to maximum applied frequency for $V_{in}$; instead, it is related to rate at which the tracking is interrupted by opening $S_1$. So long as the output buffer 6 maintains good input impedance so that it does not disturb the charge on Chold, $V_{out}$ will settle out to equal (or is at least equal to a scale factor times) the value of $V_{in}$ at the instant $S_1$ opened.

The preceeding explanation of FIG. 1 is an idealized one, largely in that it assumes that $S_1$ is a perfect switch. As we shall see, it isn't necessarily so.

Figure 2A:
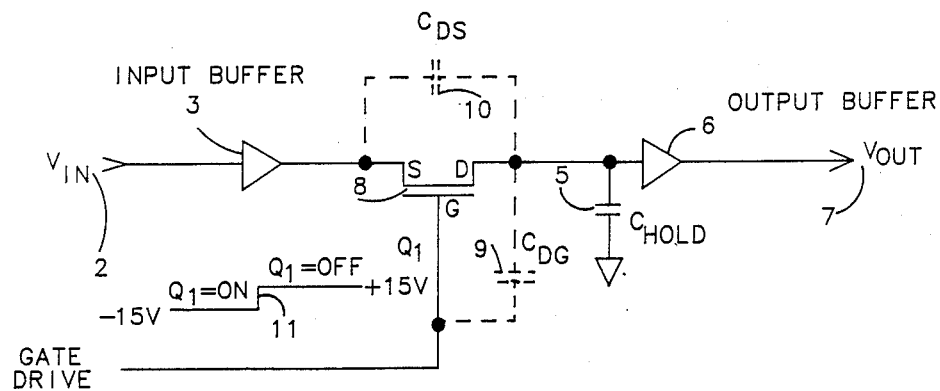
FIGS. 2A/B are a more detailed rendition of the schematic of FIG. 1, useful in understanding the limitations of the basic prior art track/hold circuit.

FIG. 2A is a more detailed depiction of the circuit of FIG. 1, with similar elements having the same reference characters. The principle difference between the figures is that switch $S_1$ has been implemented with a p-channel MOS FET $Q_1$ 8. A gate drive voltage 11 controls whether $Q_1$ is on or off. When the gate drive voltage is at $-15V$ $Q_1$ is on, and when the gate drive voltage is $+15V$ $Q_1$ is off. No other values of gate drive voltage are generated, and the on to off transition in the gate drive voltage 11 is as abrupt as practical.

$Q_1$ is not a perfect switch. It requires a finite amount of time to switch from on to off or from off to on, although that limitation shall not be our principal cause for concern in this patent application. Instead, we shall be more concerned with what to do about the ill effects arising from the inter-element capacitances associated with $Q_1$. The ones that concern us are the capacitance from the drain to gate, $C_{dg}$ 9, and the capacitance from the drain to source, $C_{ds}$ 10. As is customary with stray or unwanted impedances, these capacitances are shown with dotted lines in FIG. 2A.

Figure 2B:
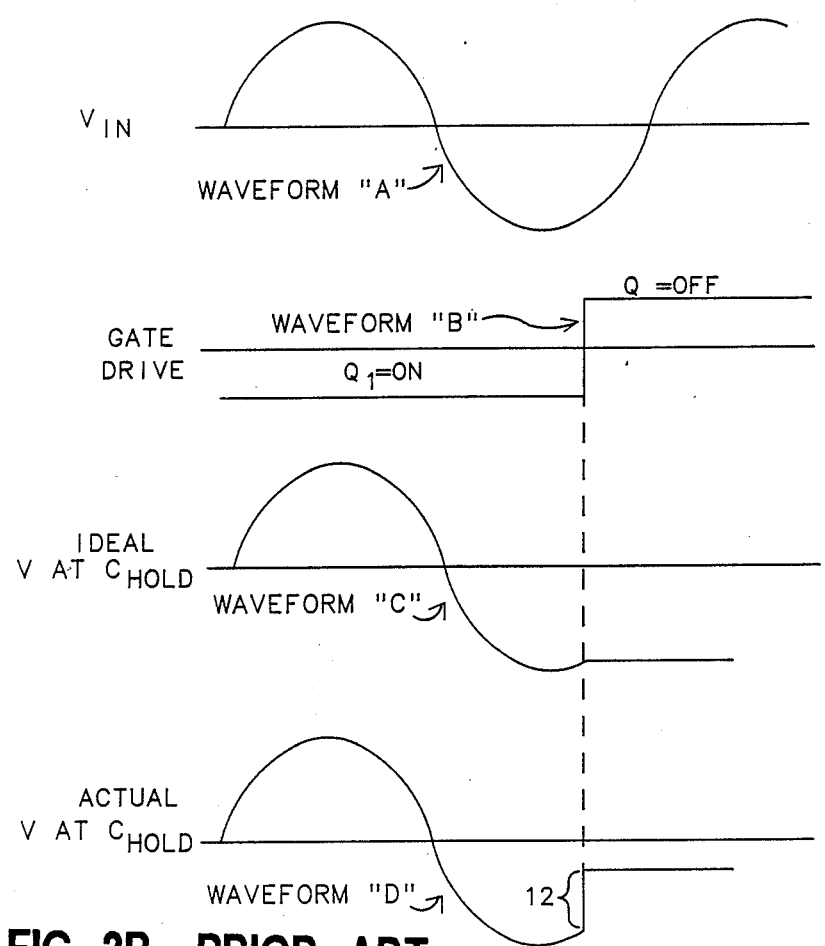

The inter-element capacitance $C_{dg}$ 9 contributes an error to the operation of the circuit of FIG. 2. When $Q_1$ is switched off by the change from $-15V$ to $+15V$ in the gate drive voltage 11, a thirty volt signal is coupled into $C_{hold}$ 5. This disturbs the charge that $S_1$ and the input buffer 3 have been applying to $C_{hold}$. This situation is shown by the waveform segments "a"–"d" in FIG. 2B. Segment "a" represents some time variant $V_{in}$ although it could be a DC voltage, too), the output of the input buffer 3, and (if $S_1$ is closed) the voltage across $C_{hold}$. Segment "b" represents the gate drive voltage 11, and shows when it switches $Q_1$ from on to off. Segment "c" represents the ideal waveform that should occur across $C_{hold}$. Note that the voltage matches that of segment "a" up until the time $Q_1$ turns off, whereupon segment "c" simply stops changing. Segment "d" illustrates the actual waveform that occurs across $C_{hold}$.

Observe that at the time when $Q_1$ turns off the voltage across $C_{hold}$ takes a positive step 12. The step 12 is the disturbance (sometimes called a "Pedestal error") caused by coupling of the gate drive signal 11 through $C_{dg}$ 9. For the sake of clarity the size of the step 12 has been exaggerated.

If the transition in the gate drive voltage 11 is always of the same amplitude, the disturbance to charge on $C_{hold}$ should always be a fixed amount (i.e., $30V(C_{dg}/C_{hold})$), and should therefore compensatable as a fixed offset. Unfortunately, it can be shown that, because $C_{dg}$ is a non-ideal semiconductor capacitance, the disturbance to the charge on $C_{hold}$ is also a function of (among other terms) $V_{in}$ and the fraction $C_{dg}/C_{hold}$. Since $C_{dg}$ is a semiconductor capacitance whose value is partly dependent upon the voltage across it, compensation cannot be exact. This situation imposes a limit upon the ultimate accuracy of the circuit of FIG. 2.

The inter-element capacitance $C_{ds}$ 10 causes a feed-through error, because it means that there is still coupling between the output of the input buffer 3 and $C_{hold}$ even though $Q_1$ is off. Little can be done to compensate such an error once it gets into $C_{holds}$; it must simply be minimized or avoided in the first place.

Figure 3:
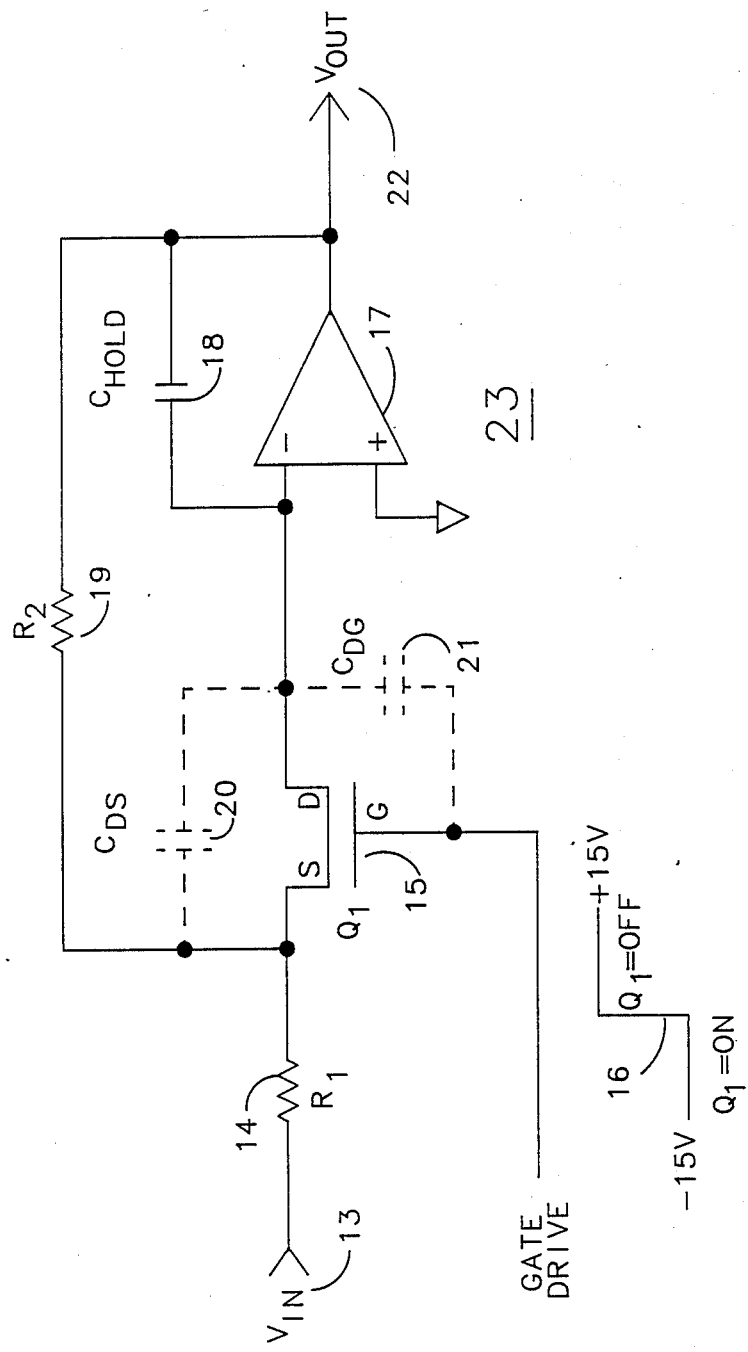
FIG. 3 is a partial schematic diagram of another prior art track/hold circuit.

We conclude this section describing prior solutions with a brief description of a somewhat different track-/hold circuit. Refer now to FIG. 3, wherein an input voltage $V_{in}$ 13 is applied through a resistor $R_1$ 14 and switch $Q_1$ 15 to the minus input of an operational amplifier 17 whose output is $V_{out}$ 22. A plus input of the amplifier 17 is connected to ground, and a holding capacitor $C_{hold}$ 18 is connected between the output of the amplifier 17 and the minus input. A resistor $R_2$ 19 is connected between the output of amplifier 17 and the junction of $R_1$ 14 and $Q_1$ 15. As in FIG. 2, $Q_1$ is a p-channel MOS FET whose conductive state is controlled by a gate drive voltage 16. The same stray capacitances $C_{ds}$ 20 and $C_{dg}$ 21 are associated with $Q_1$ 15 of FIG. 3 as are associated with $Q_1$ 8 of FIG. 2.

The operation of the circuit 23 of FIG. 3 is as follows. The input voltage $V_{in}$ is applied through resistor $R_1$ 14 to a switch $Q_1$ 15. While the gate drive voltage 16 is at $-15V$ the p-channel MOS FET $Q_1$ is on, allowing the input voltage $V_{in}$ 13 to reach the input of amplifier 17. Amplifier 17 inverts the applied signal, which is then fed back through resistor $R_2$ 19. The applied voltage $V_{in}$ and the fed back voltage $V_{out}$ sum to very nearly zero (as determined by the gain of the amplifier 17) to form a virtual ground at the source of $Q_1$ 15. When the gate drive voltage 16 changes to $+15V$ $Q_1$ turns off, causing $V_{out}$ to become static.

Certain advantages are possessed by the circuit 23 of FIG. 3. Since $Q_1$ operates at a point in the circuit that is a virtual ground, the pedestal error induced by coupling the gate drive signal through $C_{dg}$ into the $C_{hold}$/amplifier 17 combination is fixed in value, and free from dependence upon $V_{in}$. Thus, the pedestal error for the circuit of FIG. 3 is easily compensated. Furthermore, any dielectric absorption associated with capacitances in $Q_1$ are prevented from manifesting themselves, since the voltage across $Q_1$ never changes until after it is already off.

The circuit 23 of FIG. 3 also posses some disadvantages, however. Once $Q_1$ is off, a feed through error caused by coupling through $C_{ds}$ 20 is possible. A further disadvantage is that the circuit 23 requires that amplifier 17 have good input impedance, high gain and good frequency response over the complete frequency range that $V_{in}$ is allowed to experience.

SUMMARY OF THE INVENTION

The invention comprises a circuit and a method wherein, as in FIGS. 1 and 2, a closed switch allows the applied $V_{in}$ to appear across a track/hold capacitor $C_{hold}$, and a unity gain amplifier replicates (without inversion) the voltage across $C_{hold}$ when the switch is open. The switch, however, is part of a compound switch comprised of three switches (FET's) switched on and off in a particular sequence. The gate drive voltage of the FET just ahed of $C_{hold}$ is clamped to a voltage that is a fixed offset of $V_{out}$. This arrangement causes a first source of pedestal error (the drain to gate capacitance $C_{dg}$ of the FET just ahead of $C_{hold}$) to be constant and independent of the value of $V_{in}$. It is thus easily calibrated out and no ill effects arise out of the nonlinear nature of $C_{dg}$.

As in FIG. 3, $V_{out}$ is fed back to the switch upon switching from TRACK to HOLD. However, in the inventive circuit it is the noninverted $V_{out}$ that is fed back, and the feedback occurs through one of the three FET's comprising the compound switch. $V_{out}$ is fed back to a point that is the junction between the other two FET's, which are in series for the applied $V_{in}$. At one extreme of those two FET's is where $V_{in}$ is applied as an input to the overall circuit, and at the other extreme is where the applied $V_{in}$ reaches $C_{hold}$. Because of this arrangement the center point of the two FET's in the series path of $V_{in}$ to reach $C_{hold}$ is connected to a low impedance AC ground (i.e., $V_{out}$) during HOLD. This shunts feed through current to ground before it can disturb the charge on $C_{hold}$.

Another aspect of the circuit is that a second source of pedestal error is exactly and automatically compensated during the controlled sequence switching of the three FET's that make up the compound switch. During TRACK the junction of the two series FET's and the feedback FET is at $V_{in}$. During the controlled sequence switching that point experiences an initial capacitively coupled voltage disturbance and goes to some other voltage as part of the process of getting the series FET's turned off. That initial disturbance arise from the $C_{dg}$ of the FET nearest the applied $V_{in}$, which, as it is then coupled into $C_{hold}$ through the $C_{ds}$ of the FET nearest $C_{hold}$, becomes the second pedestal error. However, whatever mischief is caused by that coupling is immediately reversed when, after the two series FET's are off, the feedback FET is turned on. That cancels the initial capacitively coupled voltage disturbance by returning the point of series junction to $V_{in}$, so that whatever unwanted incremental charge to $C_{hold}$ that traveled through $C_{ds}$ of the FET nearest $C_{hold}$ to disturb the charge on $C_{hold}$ is immediately discharged.

Thus it can be seen that the method of the invention includes a compound switching means for the sequential switching of three switches: two in series with the path from $V_{in}$ to $C_{hold}$, and one between the junction of the two series switches and the $V_{out}$ produced by a unity gain buffer amplifier that replicates the $V_{in}$ captured on $C_{hold}$. One aspect of the inventive method is to clamp the voltage extremes in the control signal for the series switch closest to $C_{hold}$ to render the capacitively coupled disturbance to $C_{hold}$ from that control signal a constant quantity. This is done by clamping the off-producing excursion to a voltage level that is a constant offset from $V_{out}$. Another aspect of the inventive method removes a second capacitive disturbance to $C_{hold}$ that originates with a perturbation to the point of series connection between the two series switches. The perturbation is allowed to occur, but is then eliminated by turning on the switch between the point of series connection and $V_{out}$. The second capacitive disturbance to $C_{hold}$ is thus exactly withdrawn through the same path that it occurred in the first place. A third aspect of the inventive method suppresses feed-through error in the two series switches by connecting their point of series connection to the good AC ground afforded by $V_{out}$.

While in the tracking mode the two series switches are on and the third switch is off. To enter the hold mode the series switch nearest $C_{hold}$ is turned off first, then the series switch nearest $V_{in}$, followed by the turning on of the third switch.

DESCRIPTION OF A PREFERRED EMBODIMENT

Figure 4:
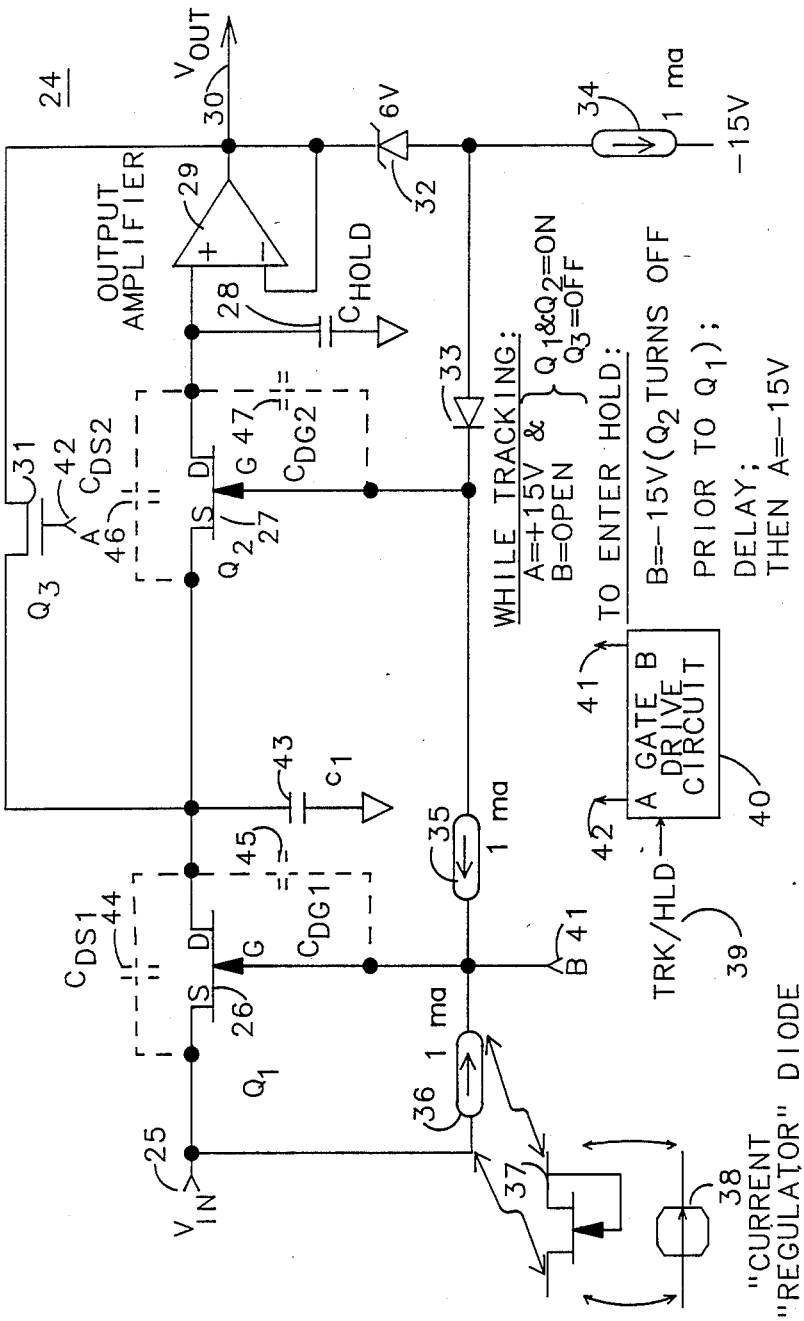
FIG. 4 is a simplified schematic diagram of a track/hold circuit constructed in accordance with the invention.

We turn now to the circuit of FIG. 4, which is a simplified schematic diagram of a track/hold circuit 24 constructed in accordance with the invention. An input voltage $V_{in}$ 25 that is to be tracked and then held is applied to the source of an n-channel junction FET (JFET) $Q_1$ 26. While tracking $V_{in}$ 25 $Q_1$ is on, and through its drain applies the input signal to a capacitor $C_1$ and the source of another n-channel JFET $Q_2$ 27. $Q_2$ 27 is also on during tracking, and through its drain applies the input signal $V_{in}$ to the voltage storage element, capacitor $C_{hold}$ 28. The applied $V_{in}$ charges and discharges $C_1$ 43 and $C_{hold}$ 28 to continuously equal $V_{in}$ at every instant. As in the basic track/hold circuit of FIGS. 1 and 2, when tracking is suspended and hold commences, the charge of $C_{hold}$ 28 is frozen and its voltage replicated for further use as $V_{out}$ 30 by an output amplifier 29. To this end, $C_{hold}$ 28 is connected to a non-inverting input of amplifier 29 of unity gain, while an inverting input thereof is connected to the resulting $V_{out}$.

$V_{out}$ is also connected to one terminal of a p-channel MOS FET $Q_3$ 31 that is off while the circuit 24 is tracking and on while it is holding. Another terminal of $Q_3$ is coupled back to the end of $C_1$ 43 that is the junction of the drain of $Q_1$ 26 and the source of $Q_2$ 27.

The gates of $Q_1$ and $Q_2$ are controlled by a gate drive signal B 41 which originates in a gate drive circuit 40. The gate of $Q_3$ is also connected to a gate control signal A 42 which originates in the gate drive circuit 40. Gate drive signals A 42 and B 41 are generated in a way that cause the three FET's $Q_1$–$Q_3$ to switch in a selected sequence when the circuit 24 goes from tracking the input voltage $V_{in}$ to holding it and producing therefrom $V_{out}$. To further these and other ends, a so-called current regulator diode 36 is connected between the source and gate of $Q_1$ 26, and a second current regulator diode 35 is connected between the gate of $Q_1$ and the gate of $Q_2$.

The remaining circuit elements of the circuit 24 of FIG. 4 include a six volt zener diode 32 in series with another current regulator diode 34. The zener diode 32 produces a six volt offset from $V_{out}$, which is coupled toone end of clamping diode 33. The other end of clamping diode 33 is connected to the gate of $Q_2$ 27.

A word is in order about the nature of the current regulator diodes. As shown by symbol 37, they are actually simply JFET's with the gate connected to one of the other terminals of the JFET. They are packaged in a two-lead axial package just as if they were small-signal diodes, and may be represented either by an oval symbol, such as used for 34, 35 and 36, or by the octagonal diode symbol 38. Current regulator diodes have forward biased current versus voltage curves that have two principal slopes. In the vicinity of the origin there is a fairly steep slope (ordinate=I, abscissa=V) that describes a relatively low resistance, say, about one thousand ohms. At the point on the I–V curve where the current equals the regulation value there is an inflection producing a second and much flatter slope describing a fairly high resistance of, say, three hundred thousand ohms. When operated on the high resistance slope it is fair to characterize the device as a constant current mechanism; hence the term "current regulator" diode. It is also possible to operate these devices so that they switch from a segment of the I versus V curve that is on one side of the knee (the point of inflection from one slope to the other) to a segment that is on the other side of the knee. Under these circumstance the device appears to be resistor of one of two different values, depending upon the applied forward bias voltage. The circuit 24 of FIG. 4 uses one milliammp current regulator diodes (the knee is at 1 ma). Device 34 is used as a constant current source to stabilize the voltage produced across zener diode 32, while devices 35 and 36 are used as switchable values of high and low resistance.

The operation of the circuit 24 of FIG. 4 is as follows. During tracking $Q_1$ and $Q_2$ are on, and $Q_3$ is off. To turn $Q_1$ and $Q_2$ on the gate drive circuit 40 creates an internal open circuit for gate drive signal B 41. This allows point B to "float", which in turn causes current regulator diodes 35 and 36 to operate in thier low resistance mode by ensuring that there is no appreciable voltage across those diodes. With current regulator diodes 35 and 36 each behaving as about one thousand ohms, and point B appearing as an open, the applied $V_{in}$ appears also at the gates of $Q_1$ and $Q_2$ (which creates a zero or low $V_{gs}$ that turns each transistor on). This state of affairs is contingent upon clamping diode 33 remaining reverse biased. We now digress briefly to explain why diode 33 is normally reverse biased, and what conditions must be met to keep it that way.

One of the most fundamental assumptions about circuit 24 is, of course, that whatever is the immediately preceding source of $V_{in}$, it is robust enough to charge and discharge $C_1$ and $C_{hold}$ at whatever rates are needed. Thus, we have a basis to assert that $V_{in}$ is present at the input of output amplifier 29. Thus, up to the point where the frequency response of output amplifier 29 begins to interfere, $V_{out}$ also varies in step with $V_{in}$. Zener diode 32 is coupled between $V_{out}$ and another current regulator diode 34 (which acts as a ballast-like load resistor), for the purpose of creating a six volt offset from $V_{out}$ and applying that offset output voltage to the anode of clamp diode 33. Neglecting the frequency response of output amplifier 29, $V_{out}$ equals $V_{in}$, so that the anode of clamp diode 33 is always six volts more negative than $V_{in}$. This ensures that clamp diode 33 is reversed biased for all allowable values of $V_{in}$ during tracking. For one actual circuit (substantially that of FIG. 6) "allowable" is any voltage whose instantaneous value is within plus or minus eleven or tweve volts of ground for DC inputs and AC inputs of, say, less than three to five MHz. Above three to five MHz the peak-to-peak value must decrease to reflect the fact that the gain of output amplifier 29 begins to fall. Thus, at ten MHz $V_{in}$ might be allowed to have an amplitude of only five volts peak-to-peak. If $V_{in}$ were allowed to be greater than that then the difference between $V_{in}$ and the now diminished $V_{out}$ could be enough to overcome the voltage of the zener diode 32 and subsequently forward bias clamp diode 33.

To return now to the main mechanisms of operation, $Q_3$ 31 will be off because, during tracking, the gate drive circuit 40 will set point A 42 to $+15V$.

Thus, under the circumstances explained above, $V_{out}$ tracks $V_{in}$, and the circuit 24 can be switched to the HOLD mode at any time.

to switch from TRACK to HOLD the logical value of the TRK/HLD line 39 is toggled from TRK to HLD. In response, the gate drive circuit 40 first sets point B 42 to $-15V$, waits a short delay, and then sets point A 41 to $-15V$. (Refer to FIG. 5 for waveforms relating to these transitions.)

When point B 42 goes from open to $-15V$ current regulator diodes 35 and 36 are heavily forward biased, and switch to behaving as resistors of about three hundred thousand ohms. That change in point B also causes $Q_1$ and $Q_2$ to turn off. $Q_2$ turns off first, followed a short time later by $Q_1$ turning off second. To achieve this, $Q_1$ is chosen to have a greater pinchoff voltage than $Q_2$. The large resistive value of diode 36 keeps point B and $V_{in}$ from loading each other. The large resistive value of diode 35 allows the gate of $Q_2$ to be at a different voltage than the gate of $Q_1$. In particular, the gate of $Q_2$ will be clamped by the now forward biased diode 33 to a voltage about seven volts more negative than $V_{out}$.

As in the case discussed for FIG. 2, $C_{hold}$ experiences a disturbance to its charge because of the coupling through $C_{dg2}$ of the gate drive voltage for $Q_2$. In contrast with the situation of FIG. 2, however, the magnitude of this voltage disturbance to $C_{hold}$ (a first pedestal error) has no terms that are dependent upon $V_{in}$. Because of the action of clamping diode 33, the size of the voltage step applied to the gate of $Q_2$ is referenced to $V_{out}$ (which is to say, to $V_{in}$). The gate of $Q_2$ will be driven by the signal at point B to a voltage that is about seven volts more negative than $V_{out}$. It can be shown that the resulting voltage error produced in $C_{hold}$ (owing to gate drive coupling through $C_{dg2}$) is $-7(C_{dg2}/C_{hold})$, which has no terms dependent upon $V_{in}$. This means that whether or not $C_{dg2}$ is nonlinear wih the voltage across its terminals is of no particular concern, since that amount of voltage is always the same. Hence, the first pedestal error is a constant offset that is correctable through calibration.

Once $Q_1$ and $Q_2$ are both off $Q_3$ can be turned on. There are two benefits that arise from turning $Q_3$ on. The first of these is a substantial reduction in the amount of feed-through error reaching $C_{hold}$ by way of $C_{ds1}$ 44 and $C_{ds2}$ 46. This is because $Q_3$ now acts as a low impedance connection to an effective AC ground (the output of amplifier 29), which shunts the error producing current away from the series combination of $C_{ds2}$ and 46 and $C_{hold}$ 28. The second benefit concerns removal of a second pedestal error. To properly appreciate the mechanism of this second benefit we must describe in a bit more detail what happens when $Q_1$ and $Q_2$ turns off.

Once $Q_2$ is off, there is a second pedestal error that arises when $Q_1$ is turned off. The capacitor $C_1$ 43 experiences a voltage disturbance of magnitude:

$$DELTA_{C_1} = (V_{in} - 15)(C_{dg1}/C_1) \qquad \text{Eq. 1}$$

This voltage disturbance to $C_1$ will be coupled into $C_{hold}$ through $C_{ds2}$. The resulting voltage disturbance to $C_{hold}$ (the second pedestal error) will be:

$$DELTA_{C_{hold}} = (V_{in} - 15)(C_{dg1}/C_1)(C_{ds2}/C_{hold}) \qquad \text{Eq. 2}$$

This is a real nasty quantity to have loose in the circuit, since it includes a term dependent upon $V_{in}$ and involves the nonlinear capcitances $C_{dg1}$ and $C_{dg2}$.

Note, however, that whatever couples through $C_{ds2}$ into $C_{hold}$ does so at the expense of changing the charge on $C_1$. (After all, if there were no pedestal errors owing to stray inter-element capacitances, the voltage on $C_1$ would remain $V_{in}$, just as it would for $C_{hold}$.) This means that after $Q_1$ and $Q_2$ are both off and things settle out, the disturbance to $C_{hold}$ of Eq. 2 can be exactly removed by forcing the voltage on $C_1$ back to what it ought to be, viz., the captured value of $V_{in}$, which is to say, $V_{out}$. The second benefit of turning $Q_3$ on is forcing $C_1$ back to $V_{out}$. This exactly undoes the disturbance to $C_{hold}$ caused by coupling through $C_{ds2}$, by coupling an equal and opposite amount of charge through the same $C_{ds2}$.

Figure 5:
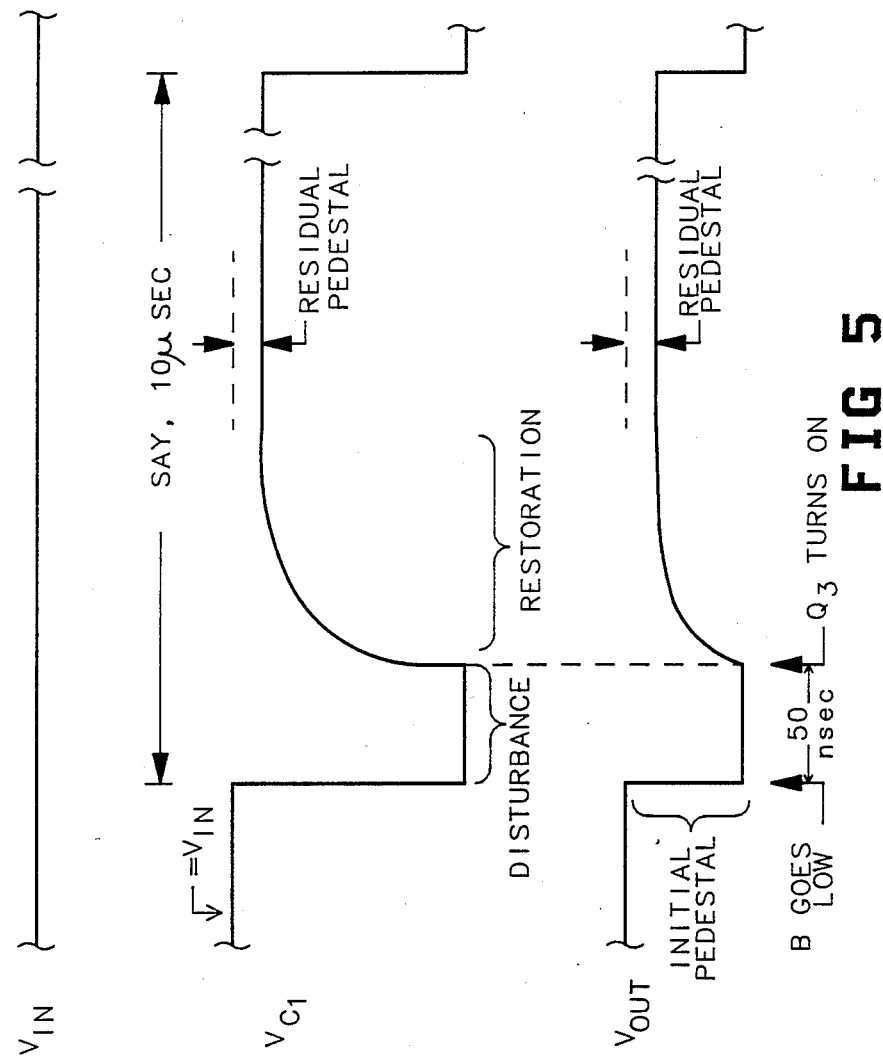
FIG. 5 is a waveform diagram illustrating an aspect of the operation of the circuit of FIG. 4.

FIG. 5 illustrates the relationship between the voltage across $C_1$ and $V_{out}$ that arises as a result of the selective switching of $Q_1$–$Q_3$ used to transition from TRACK to HOLD. In particular, it illustrates that the voltage disturbance to $C_1$ arising when gate drive signal B goes low is completely restored by the action of $Q_3$. The resulting initial pedestal in $V_{out}$ is nearly completely corrected by the restoration of the voltage on $C_1$. All that remains uncorrected is a residual pedestal whose causes are outside the scope of the $Q_3$ correction mechanism; e.g., the pedestal owing to $C_{dg2}$. In any event, the residual pedestal is essentially a constant error that can be calibrated out.

Figure 6:
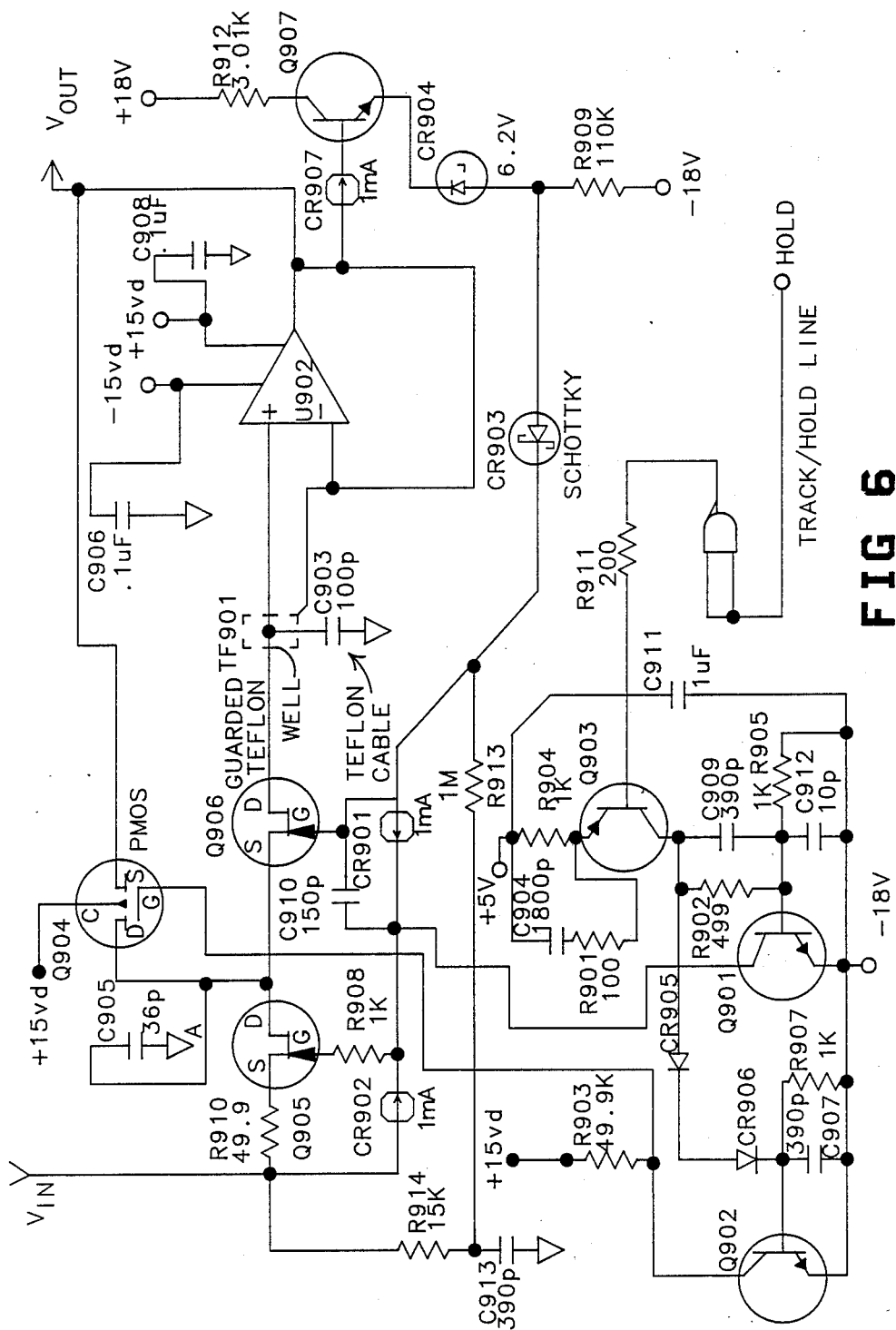
FIG. 6 is a detailed schematic diagram of an actual track/hold circuit constructed in accordance with the invention and used in the Hewlett-Packard 3458A Digital Multimeter.

Figure six is a simplified schematic of an actual track-/hold circuit used in the Hewlett-Packard 3458A Digital Multimeter. The operation of the circuit of FIG. 6 is substantially the same as that of FIG. 4. $Q_{905}$ of FIG. 6 corresponds to $Q_1$ of FIG. 4. Likewise, $Q_{906}$ corresponds to $Q_2$, $Q_{904}$ corresponds to $Q_3$, $U_{902}$ to output amplifier 29, $CR_{903}$ to clamping diode 33, and $Q_{901}$–$Q_{903}$ to gate drive circuit 40. In the actual circuit of FIG. 6 $C_{903}$ corresponds to $C_{hold}$, and is constructed from a length of coaxial cable having a Teflon dielectric. This is done to reduce the dielectric absorption of that capacitor to an absolute minimum. Further, the ungrounded end of $C_{903}$ is placed in a guarded Teflon well. The guard is simply a plated-through hole in the printed circuit board that is driven by $V_{out}$. The hole receives the Teflon well. This is done to reduce the stray capacitance in parallel with $C_{hold}$ to an absolute minimum. The reason for going to such trouble is that any such stray capacitances are apt to be sources of harmful dielectric absorption that limit the performance of the circuit.

While on the subject of dielectric absorption, it should be noticed that $Q_1$, $Q_2$ and $Q_3$ do not contribute dielectric absorption errors to the operation of the circuits of FIGS. 4 and 6. In the TRACK mode the gates, sources and drains of $Q_1$ and $Q_2$ are all at the same potential ($V_{in}$), so there are no charged inter-element FET capacitances present when the circuit switches to HOLD. Thus, the charge transferred to $C_{hold}$ through the FET inter-element capacitances is the same for any value of $V_{in}$, and also for any slew rate in $V_{in}$. Therefore, it doesn't matter if the stray inter-element FET capacitances have rotten dielectric absorption or not.

I claim:

1. A circuit for tracking an applied input while in a track mode and subsequently capturing an instantaneous value of the applied input and during a hold mode replicating that captured value as an output, the circuit comprising:

a first switch having conditions of on and off, a first terminal for receiving an applied input referenced to a signal ground, and a second terminal;

A second switch having conditions of on and off, a first terminal, and a second terminal;

a capacitor having a first terminal and also a second terminal that is connected to the signal ground;

an amplifier of non-inverting unity gain having an input and also an output producing an output voltage;

a third switch having conditions of on and off and having first and second terminals;

the second terminal of the first switch being connected to the first terminal of the second switch and also to the first terminal of the third switch;

the second terminal of the second switch being connected to the input of the amplifier and also connected to the first terminal of the capacitor;

the output of the amplifier being coupled to the second terminal of the third switch; and switch control means coupled to the first, second and third switches for implementing a track mode by causing the first and second switches to be on and the third switch to be off and also for immplementing the hold mode by, in sequential order, causing the second switch to be off, then causing the first switch to be off, and then causing the third switch to be on.

2. A circuit as in claim 1 wherein the first, second and third switches are transistors and further comprising a second capacitor connected between the signal ground and the second terminal of the first switch.

3. A circuit as in claim 1 wherein the condition of the second switch is controlled by an applied control voltage, and further wherein excursions of that control voltage in a direction that turn the second switch off are clamped to a voltage level that is a constant offset from the output voltage produced at the output of the amplifier.

4. A circuit for tracking an applied input while in a track mode and subsequently capturing an instantaneous value of the applied input referenced to a signal ground and during a hold mode replicating that captured value as an output the circuit comprising:

a first switching transistor having first, second and control terminals;

a second switching transistor having first, second and control terminals, the first of which being coupled at a first junction point to the second terminal of the first switching transistor;

a first capacitor coupled between the first junction point and a signal ground;

unity gain amplification means having an input that is coupled at a second junction point to the second terminal of the second switching transistor, and also having an output;

a second capacitor coupled between the second junction point and the signal ground;

a third switching tranistor having first, second and control terminals, the first of which being coupled to the output of the unity gain amplification means, and the second of which being coupled to the first junction point;

track/hold control means having an input responsive to a signal indicating whether to track an input voltage applied to the first terminal of the first switching transistor or whether to hold an instantaneous value of the input voltage and replicate it as an output voltage produced at the output of the unity gain amplification means, the track/hold control means also having first and second control outputs, each having first and second states, for controlling the conductive state of the first, second and third switching transistors, the first control output being coupled to the control terminal of the third switching transistor and the second control output being coupled to the control terminal of the first switching transistor;

first voltage sensitive resistance means coupled between the first and control terminals of the first switching transistor, for exhibiting a low value of resistance when the second control output is in the first state and a high value of resistance when the second control output is in the second state; and second voltage sensitive means coupled between the control terminals of the first and second switching transistors, for exhibiting a low value of resistance when the second control output is in the first state and a high value of resistance when the second control output is in the second state.

5. A circuit as in claim 4 further comprising:

means, coupled to the output of the unity gain amplification means and to the junction of the second voltage sensitive resistance means and the control terminal of the second switching transistor, for clamping, during times when the second control output is in the second state, the voltage on the control terminal of the second switching transistor to the a voltage that is a constant offset from the voltage at the output of the unity gain amplification means.

6. A circuit for tracking an applied input while in a track mode and subsequently capturing an instantaneous value of the applied input and during a hold mode producing from that captured value a corresponding output signal, the circuit comprising:

a switch having conditions of on and off, a first terminal for receiving an applied input referenced to a signal ground, a second terminal, and a control terminal for receiving a control signal having first and second states that respectively produce the conditions of on and off.

a capacitor connected between the second terminal of the switch and the signal ground;

an amplifier having an input connected to the second terminal of the switch and also having an output for producing an output signal that corresponds to the voltage on the capacitor; and means coupled to the output of the amplifier and to the control terminal of the switch, for limiting the magnitude of control signal excursions into the second state to a value equaling a constant offset from the output of the amplifier.

* * * * *